(12) United States Patent
Hjelm

(10) Patent No.: US 7,436,236 B2
(45) Date of Patent: Oct. 14, 2008

(54) ANALOG DC COMPENSATION

(75) Inventor: Mikael Hjelm, Vasceras (SE)

(73) Assignee: Infineon Technologies AG (DE)

( * ) Notice: Subject to any disclaimer, the term of this patent is extended or adjusted under 35 U.S.C. 154(b) by 685 days.

(21) Appl. No.: 11/144,373

(22) Filed: Jun. 3, 2005

(65) Prior Publication Data

US 2005/0271163 A1      Dec. 8, 2005

(30) Foreign Application Priority Data

Jun. 4, 2004      (EP)  ................................. 04013261

(51) Int. Cl.
*H03L 5/00*      (2006.01)
(52) U.S. Cl. ...................... 327/307; 327/551
(58) Field of Classification Search .............. 327/34, 327/165, 307, 310–317, 551
See application file for complete search history.

(56) References Cited

U.S. PATENT DOCUMENTS

| | | | | |
|---|---|---|---|---|
| 5,030,850 | A * | 7/1991 | Lunsford | 327/77 |
| 5,274,273 | A * | 12/1993 | Baginski et al. | 327/72 |
| 5,563,587 | A * | 10/1996 | Harjani | 340/870.3 |
| 5,699,256 | A * | 12/1997 | Shibuya et al. | 701/220 |
| 5,760,629 | A * | 6/1998 | Urabe et al. | 327/307 |
| 5,945,864 | A * | 8/1999 | Weber et al. | 327/307 |
| 5,978,422 | A * | 11/1999 | Weber et al. | 375/317 |
| 6,417,707 | B1 * | 7/2002 | Underhill et al. | 327/165 |
| 6,498,929 | B1 | 12/2002 | Tsurumi et al. | |
| 6,535,560 | B1 | 3/2003 | Masenten | |
| 7,095,997 | B2 * | 8/2006 | Conti | 455/317 |
| 7,155,185 | B2 * | 12/2006 | Pipilos | 455/232.1 |
| 2002/0160738 | A1 | 10/2002 | Allott et al. | |
| 2003/0148750 | A1 | 8/2003 | Yan et al. | |

FOREIGN PATENT DOCUMENTS

| | | |
|---|---|---|
| EP | 0 863 606 A1 | 9/1998 |
| EP | 0 964 557 A1 | 12/1999 |
| WO | WO-98/38799 A1 | 9/1998 |
| WO | WO-99/46852 A1 | 9/1999 |

* cited by examiner

*Primary Examiner*—N. Drew Richards
*Assistant Examiner*—Thomas J Hiltunen
(74) *Attorney, Agent, or Firm*—Dickstein, Shapiro, LLP.

(57) ABSTRACT

Arrangement for analog compensation of a DC component in an AC signal having an estimator for producing an estimate corresponding to the DC component, a compensator for producing a present compensating signal according to the estimate, an adder for adding the present compensating signal to the AC signal, and a comparator for continuously comparing the present estimate with the present compensating signal. If the difference between the present estimate and the present compensating signal lies outside of a predefined interval, then the comparator triggers the compensator to produce an updated compensating signal according to the present estimate, and to switch from the present compensating signal to the updated compensating signal, and the adder adds the updated compensating signal to the AC signal. If the difference lies within the predefined interval, then the compensator continues to produce the present compensating signal, and the adder adds the present compensating signal to the AC signal.

20 Claims, 2 Drawing Sheets

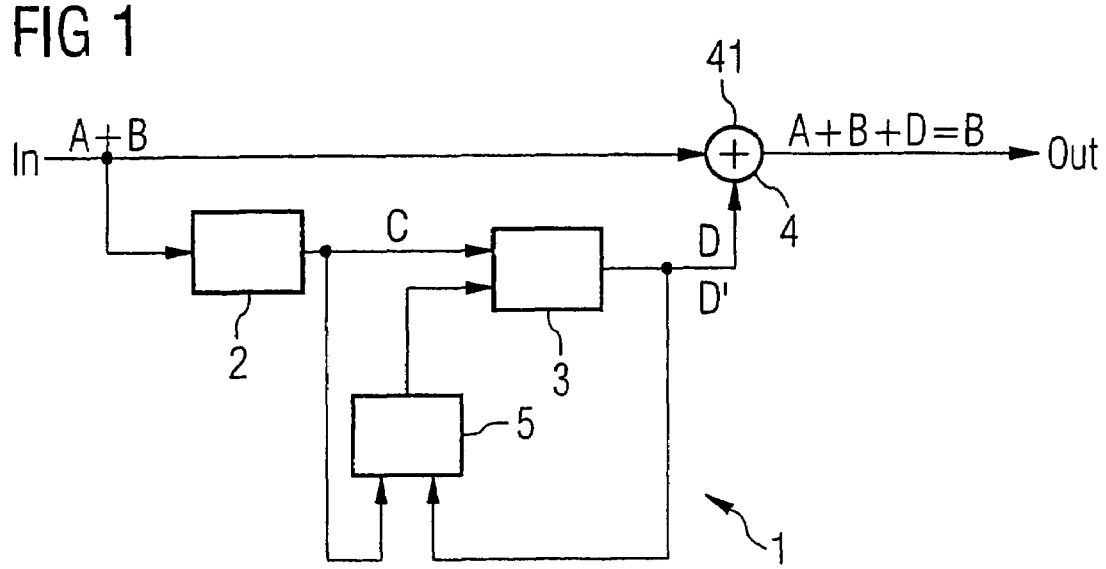
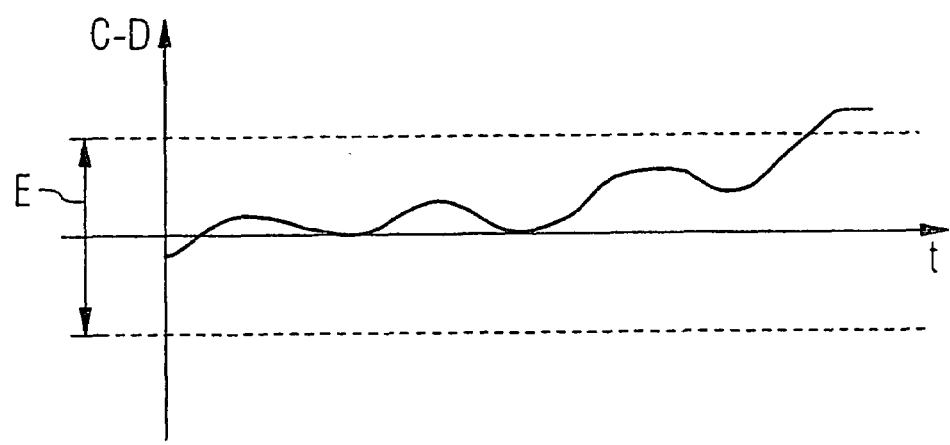

ANALOG DC COMPENSATION

CROSS-REFERENCE TO RELATED APPLICATION

This application claims priority to European Patent Application Serial. No. 04013261.5, filed Jun. 4, 2004.

FIELD OF THE INVENTION

The present invention relates an arrangement for an analog compensation of a DC component in an AC signal. The inventive arrangement comprises an estimating unit, a compensating unit and an adding unit, the estimating unit being adapted to produce an estimate corresponding to the DC component, the compensating unit being adapted to produce a compensating signal according to the estimate, and the adding unit being adapted to add the compensating signal to the AC signal.

BACKGROUND OF THE INVENTION

There are applications where a DC offset inhibits performance thereby being unacceptable from a performance perspective.

The foremost applications for the present invention are Homodyne RF and high-end audio, but other areas might benefit as well. The most benefit is when there is a need to compensate for slow drifts like temperature.

Presently known solutions can generally be divided into two different approaches. One approach is continuously used where a high pass filter is blocking the DC component and letting the AC component pass. This approach will present problems with applications where there are low frequency components in the required signal, which thus will suffer if a high pass filter is coupled in the signal path.

Another approach is used only in the beginning of a process, such as in the set-up of a communication session, where an initial estimation of the DC component will be followed by a fixed compensation value used throughout the process. This latter approach suffers from long-term DC drifts or variations, such as temperature dependent variations, where the fixed compensation value will be unable to compensate for the changed DC component.

SUMMARY OF THE INVENTION

From the standpoint of the field of invention, as described above, the present invention teaches that the use of a version of the latter approach of solving the problem with an analog circuit that detects a DC drift and reiterates the estimation and compensation. The present invention uses a switch to update the DC compensation that does not disturb the signal unless it switches. The present invention is also made to avoid having the signal path go through it, which should ease the implementation requirements since it is easier to do a LF circuit.

An inventive arrangement for an analog compensation of a DC component in an AC signal comprises an estimating unit, a compensating unit and an adding unit. The estimating unit is adapted to produce an estimate corresponding to the DC component, the compensating unit is adapted to produce a compensating signal according to the estimate, and the adding unit is adapted to add the compensating signal to the AC signal. The present invention specifically teaches that the arrangement comprises a comparing unit, which is adapted to continuously compare the present estimate with the compensating signal.

If the difference between the present estimate and the compensating signal lies outside of a predefined interval, then the comparing unit is adapted to trigger the compensating unit to produce an updated compensating signal according to the present estimate, to switch from the present compensating signal to the updated compensating signal, and the adding unit is adapted to add the updated compensating signal to the AC signal.

If the difference between the present estimate and the compensating signal lies within the predefined interval, then the compensating unit is adapted to continue with the present compensating signal, and the adding unit is adapted to add the present compensating signal to the AC signal.

An advantage of the present invention is providing a possibility to continuously compensate for a DC component in an AC signal without putting an high pass filter in the signal path and with compensation for long term variations in the DC component.

BRIEF DESCRIPTION OF THE DRAWINGS

An arrangement according to the present invention will now be described in more detail with reference to accompanying drawings, in which:

FIG. 1 is a schematic and simplified view of an arrangement according to the present invention;

FIG. 2 is a graph schematically representing the predefined interval and the variation of the difference between the estimate and the compensating signal;

DETAILED DESCRIPTION OF PREFERRED EMBODIMENTS OF THE INVENTION

Figure 3:
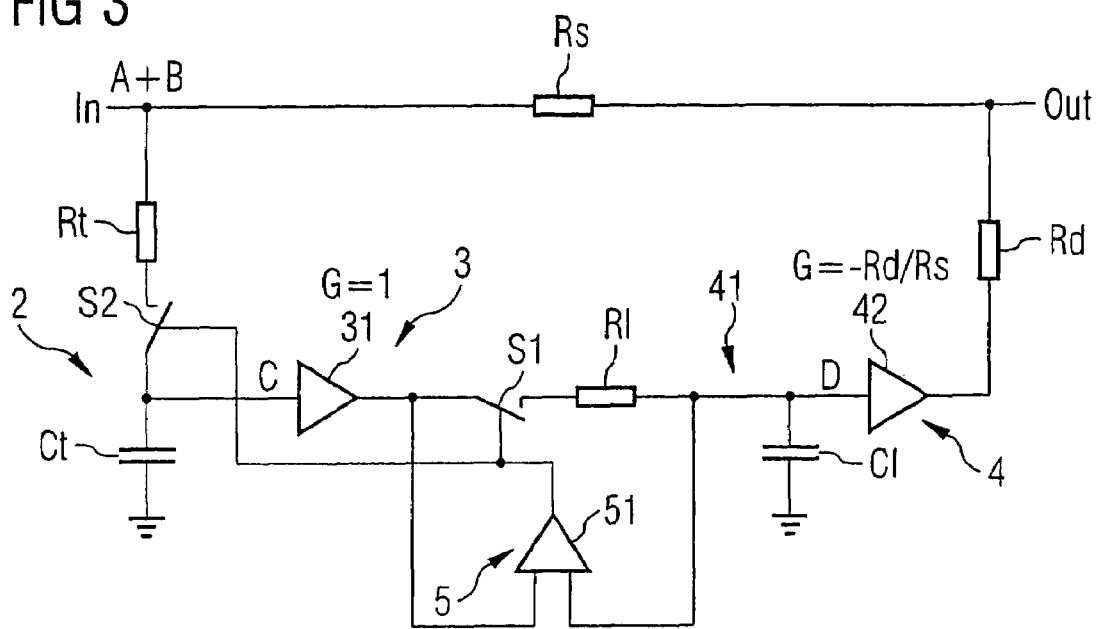
FIG. 3 is a schematic and simplified circuit diagram of a first embodiment of an arrangement according to the present invention.

FIG. 1 shows an arrangement 1 for an analog compensation of a DC component A in an AC signal B.

The arrangement comprises an estimating unit 2, a compensating unit 3 and an adding unit 4.

The estimating unit 2 is adapted to produce an estimate C corresponding to the DC component A, the compensating unit 3 is adapted to produce a compensating signal D according to the estimate C, and the adding unit 4 is adapted to add the compensating signal D to the AC signal B.

The present invention specifically teaches that the arrangement 1 comprises a comparing unit 5, which is adapted to continuously compare the present estimate C with the compensating signal D.

If the difference between the present estimate C and the compensating signal D lies outside of a predefined interval E, schematically shown in FIG. 2, then the comparing unit 5 is adapted to trigger the compensating unit 3 to produce an updated compensating signal D' according to the present estimate C, and to switch from the present compensating D signal to the updated compensating signal D'. The adding unit 4 is adapted to add the updated compensating signal D' to the AC signal B.

If the difference between the present estimate C and the compensating signal D lies within the predefined interval E, then the compensating unit is adapted to continue with the present compensating signal D, and the adding unit is adapted to add the present compensating signal D to the AC signal B.

The interval E is adapted to allow a certain drift and ripple in the estimate C without triggering an update of the compensating signal D. The present invention does not specify the interval E since this is an application dependent parameter that will vary greatly between different applications of the present invention. It is however obvious for the skilled man how to set this parameter for a specific application of the invention.

The adding unit 4 comprises a smoothing unit 41 in order to provide a smooth transition between a recent compensating signal D and an updated compensating signal D'.

The invention could be implemented discretely with the circuit shown in FIG. 3. Here it is shown that the estimating unit 2 is made out of a low pass filter comprising the resistance Rt and capacitance Ct, that the compensating unit 3 is made out of a unity gain amplifier 31, and that the comparing unit 5 is made out of a comparator 51 which is adapted to control a first switch S1, which first switch S1 is adapted to connect the adding unit 4 to the compensating unit 3 for an update of the compensating signal D and to disconnect the adding unit 4 from the compensating unit 3 during estimation of the DC component A.

The invention also teaches that the comparator 5 is adapted to control a second switch S2, which second switch S2 is adapted to connect the estimating unit 2 to the AC signal B during estimation of the DC component A and disconnecting the estimating unit 2 from the AC signal B during update of the compensating signal D.

The first switch S1 will thus prevent noise from propagating to the adding unit 4 during estimation and the second switch S2 will prevent noise from interfering with the updating of the compensating signal D.

The adding unit may be implemented in different ways. FIG. 3 shows one embodiment where the adding unit 4 comprises a serial resistance Rs that is positioned in the signal path. The adding unit also comprises a voltage amplifier 42 in series with a draw resistance Rd. The gain for the voltage amplifier 42 equals −Rd/Rs, thus providing a voltage drop across the serial resistance Rs corresponding to the compensating signal D and the estimate C of the DC component A.

Figure 4:
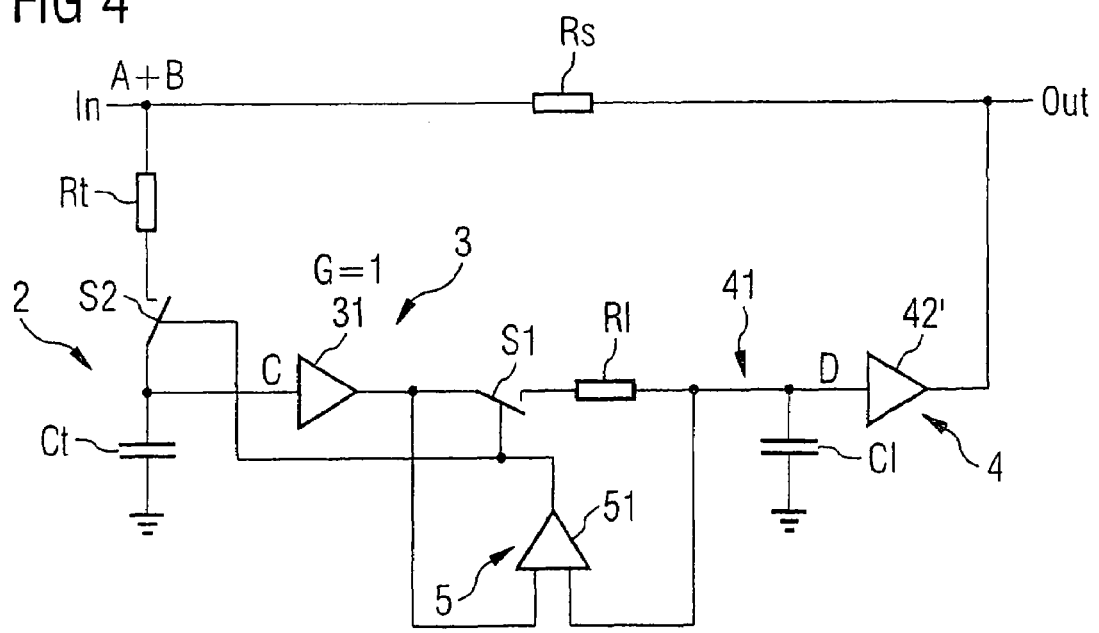
FIG. 4 is a schematic and simplified circuit diagram of a second embodiment of an arrangement according to the present invention.

FIG. 4 shows another possible embodiment where the adding unit comprises the serial resistance Rs positioned in the signal path, and a transconductance amplifier 42', which is adapted to draw a current through the serial resistance Rs, thus providing a voltage drop across the serial resistance Rs corresponding to the compensating signal D or the estimate C of the DC component A.

FIGS. 3 and 4 shows that the smoothing unit 41 is made out of an RC circuit comprising a resistance R1 and a capacitance C1, and that the compensating signal is updated over a time period corresponding to the time constant of the RC circuit.

The capacitance C1 in the smoothing unit 41 also has the function of keeping a voltage level corresponding to the compensating signal D during the estimation of the DC component A when the first switch S1 is open and the capacitance Ct in the estimating unit 2 also has the function of keeping a voltage level corresponding to the estimate C during the updating of the compensating signal D when the second switch S2 is open.

This means that in a first state of the arrangement, when the first switch S1 is open and the second switch S2 is closed, which is as long as difference between the estimate C and the compensating signal D is within the set predefined interval E, then is the present compensating signal D represented by the voltage that is upheld by the capacitance C1 belonging to the smoothing unit 41 in the adding unit 4. If the DC component A varies enough to cause the difference between the estimate C and the compensating signal D to end up outside of the predefined interval E, then the arrangement 1 will go from its first state into a second state.

In this second state of the arrangement, the first switch S1 is closed and the second switch S2 is open, which is as long as difference between the estimate C and the compensating signal D is outside of the predefined interval E, then the present compensating signal D is replaced with an updated compensating signal D', meaning that the voltage upheld by the capacitance C1, belonging to the estimating unit, which voltage represents the current estimate, is propagated to the capacitance C1, belonging to the smoothing unit 41 in the adding unit 4, thus representing the updated compensating signal D'. The difference between the estimate C and the compensating signal D' will diminish as the capacitor C1 is charged to represent the updated compensating value D' and the arrangement will go from its second state into its first state.

It will be understood that the invention is not restricted to the aforedescribed and illustrated exemplifying embodiment thereof and that modifications can be made within the scope of the inventive concept as illustrated in the accompanying claims.

What is claimed is:

1. An arrangement for an analog compensation of a DC component in an AC signal, comprising:
   an estimator adapted to produce an estimate corresponding to the DC component;
   a compensator adapted to produce a present compensating signal according to the estimate;
   an adder adapted to add the present compensating signal to the AC signal; and
   a comparator adapted to continuously compare the present estimate with the present compensating signal, wherein
   if the difference between the present estimate and the present compensating signal lies outside of a predefined interval, then the comparator triggers the compensator to produce an updated compensating signal according to the present estimate, and to switch from the present compensating signal to the updated compensating signal, and the adder adds the updated compensating signal to the AC signal, and
   if the difference between the present estimate and the present compensating signal lies within the predefined interval, then the compensator continues to produce the present compensating signal, and the adder adds the present compensating signal to the AC signal.

2. The arrangement according to claim 1, wherein the interval is adapted to allow a certain drift and ripple in the estimate without triggering an update of the present compensating signal.

3. The arrangement according to claim 2, wherein the adder comprises a smoother in order to provide a smooth transition between the present compensating signal and the updated compensating signal.

4. The arrangement according to claim 1, wherein the estimator comprises a low pass filter, the compensator comprises a unity gain amplifier, and the comparator comprises a further comparator which is adapted to control a first switch, the first switch being adapted to connect the adder to the compensator for an update of the present compensating signal and disconnecting the adder from the compensating unit during estimation of the DC component.

5. The arrangement according to claim 4, wherein the comparator is adapted to control a second switch adapted to connect the estimator to the AC signal during estimation of the DC component and disconnect the estimator from the AC signal during update of the present compensating signal.

6. The arrangement according to claim 4, wherein the adder comprises a serial resistance Rs, positioned in the signal path, and a voltage amplifier in series with a draw resistance Rd, and the gain for the voltage amplifier equals Rd/Rs, thereby providing a voltage drop across the serial resistance corresponding to the estimate of the DC component or the present compensating signal.

7. The arrangement according to claim 4, wherein the adder comprises a serial resistance, positioned in the signal path, and a transconductance amplifier, which is adapted to draw a current through the serial resistance, thereby providing a voltage drop across the serial resistance corresponding to the estimate of the DC component or the present compensating signal.

8. The arrangement according to claim 3, wherein the smoother comprises an RC circuit, and the present compensating signal is updated over a time period corresponding to the time constant of the RC circuit.

9. An arrangement for an analog compensation of a DC component in an AC signal, comprising:

an estimating means for producing an estimate corresponding to the DC component;

a compensating means for producing a present compensating signal according to the estimate;

an adding means for adding the present compensating signal to the AC signal; and a comparing means for continuously comparing the present estimate with the present compensating signal, wherein if the difference between the present estimate and the present compensating signal lies outside of a predefined interval, then the comparing means triggers the compensating means to produce an updated compensating signal according to the present estimate, and to switch from the present compensating signal to the updated compensating signal, and the adding means adds the updated compensating signal to the AC signal, and if the difference between the present estimate and the present compensating signal lies within the predefined interval, then the compensating means continues to produce the present compensating signal, and the adding means adds the present compensating signal to the AC signal.

10. The arrangement according to claim 9, wherein the interval is adapted to allow a certain drift and ripple in the estimate without triggering an update of the present compensating signal.

11. The arrangement according to claim 10, wherein the adding means comprises a smoothing means for providing a smooth transition between the present compensating signal and the updated compensating signal.

12. The arrangement according to claim 9, wherein the estimating means comprises a low pass filter, the compensating means comprises a unity gain amplifier, and the comparing means comprises a comparator for controlling a first switching means, the first switching means for connecting the adding means to the compensating means for an update of the present compensating signal and disconnecting the adding means from the compensating means during estimation of the DC component.

13. The arrangement according to claim 12, wherein the comparing means controls a second switching means for connecting the estimating means to the AC signal during estimation of the DC component and disconnecting the estimating means from the AC signal during update of the present compensating signal.

14. The arrangement according to claim 12, wherein the adding means comprises a serial resistance Rs, positioned in the signal path, and a voltage amplifier in series with a draw resistance Rd, and the gain for the voltage amplifier equals Rd/Rs, thereby providing a voltage drop across the serial resistance corresponding to the estimate of the DC component or the present compensating signal.

15. The arrangement according to claim 12, wherein the adding means comprises a serial resistance, positioned in the signal path, and a transconductance amplifying means for drawing a current through the serial resistance, thereby providing a voltage drop across the serial resistance corresponding to the estimate of the DC component or the present compensating signal.

16. The arrangement according to claim 11, wherein the smoothing means comprises an RC circuit, and the present compensating signal is updated over a time period corresponding to the time constant of the RC circuit.

17. A method for analog compensating a DC component in an AC signal, comprising the steps of:

producing an estimate corresponding to the DC component;

producing a present compensating signal according to the estimate;

adding the present compensating signal to the AC signal; and continuously comparing the present estimate with the present compensating signal, wherein if the difference between the present estimate and the present compensating signal lies outside of a predefined interval, then producing an updated compensating signal according to the present estimate, and switching from the present compensating signal to the updated compensating signal, and adding the updated compensating signal to the AC signal, and if the difference between the present estimate and the present compensating signal lies within the predefined interval, then continuing to produce the present compensating signal, and adding the present compensating signal to the AC signal.

18. The method according to claim 17, further comprising the step of adapting the interval to allow a certain drift and ripple in the estimate without triggering an update of the present compensating signal.

19. The method according to claim 18, further comprising the step of smoothing the transition between the present compensating signal and the updated compensating signal.

20. The method according to claim 19, further comprising the step of updating the present compensating signal over a time period corresponding to the time constant of the RC circuit.

* * * * *